United States Patent
Hirschmann

(10) Patent No.: US 6,756,778 B2
(45) Date of Patent: Jun. 29, 2004

(54) MEASURING AND/OR CALIBRATING A TEST HEAD

(75) Inventor: Peter Hirschmann, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/273,949

(22) Filed: Oct. 18, 2002

(65) Prior Publication Data

US 2003/0102857 A1 Jun. 5, 2003

(30) Foreign Application Priority Data

Dec. 3, 2001 (DE) .......................................... 101 59 165

(51) Int. Cl.⁷ .......................... G01R 1/04; G01R 31/02
(52) U.S. Cl. .................................... 324/158.1; 324/754
(58) Field of Search ............................. 324/158.1, 754, 324/757, 758, 765, 72.5; 73/865.8, 866.5; 414/590

(56) References Cited

U.S. PATENT DOCUMENTS

| | | | |
|---|---|---|---|
| 4,665,360 A | * 5/1987 | Phillips | 324/754 |
| 5,453,995 A | 9/1995 | Behrens | 371/27 |
| 5,499,248 A | 3/1996 | Behrens et al. | 371/22.1 |
| 5,552,701 A | * 9/1996 | Veteran et al. | 324/158.1 |
| 5,606,262 A | * 2/1997 | Montalbano et al. | 324/758 |
| 5,923,180 A | * 7/1999 | Botka et al. | 324/758 |
| 6,114,869 A | * 9/2000 | Williams et al. | 324/754 |
| 6,396,257 B1 | * 5/2002 | Baum et al. | 324/158.1 |
| 6,570,397 B2 | * 5/2003 | Mayder et al. | 324/158.1 |

FOREIGN PATENT DOCUMENTS

| | | |
|---|---|---|
| DE | 4221075 A1 | 1/1993 |
| DE | 19503329 C2 | 5/2000 |
| EP | 0859318 A1 | 8/1998 |
| EP | 0864977 A1 | 9/1998 |
| EP | 0882991 A1 | 12/1998 |
| EP | 0886214 A1 | 12/1998 |
| EP | 0965845 A1 | 12/1999 |
| EP | 0999450 A1 | 5/2000 |
| EP | 1092983 A1 | 4/2001 |

OTHER PUBLICATIONS

"Agilent 83000A Series Microwave System Amplifiers", Agilent Technologies Product Overview.
"Agilent 93000 SOC Series" Agilent Technologies System-on-a-Chip (SOC) Test—Technology Home page.

* cited by examiner

Primary Examiner—Kamand Cuneo
Assistant Examiner—Jermele M. Hollington
(74) Attorney, Agent, or Firm—Perman & Green, LLP

(57) ABSTRACT

A device for calibrating a test head of a testing device, where the test head has multiple electric contacts which are positioned in a contact region, has a contacting unit, which is dockable on the test head such that the contacting unit covers the contact region of the test head. The contacting unit includes a contact head, which has at least one measuring contact for contacting the contacts of the test head and is multi-dimensionally movable within the contacting unit using a positioning unit such that the contact head may approach and contact at least multiple contacts of the contact region. The device also has a control unit, which operates the positioning unit in calibration operation such that multiple or all contacts of the contact region to be contacted for calibrating the test head are automatically approached and contacted by the contacting head.

19 Claims, 6 Drawing Sheets

MEASURING AND/OR CALIBRATING A TEST HEAD

BACKGROUND

The present invention relates to a device for electrical measurement and/or calibration of a test: head of a testing device for testing electronic components.

Complex electronic components, such as microprocessors, may be tested and/or measured in regard to their proper functioning and performance with the aid of special testing devices. For this purpose, a testing device of this type has a test head, which has multiple electronic contacts arranged in a contact region, which is, in particular, flat. The components to be tested are positioned on a circuit board which has contact zones connected to the terminals of the components to be tested. As the circuit board is placed on the test head, the contacts of the test head may contact the contact zones of the circuit board, so that the test routine may run.

For example the product lines 83000 and 93000 from Agilent Technologies, as disclosed e.g. under http://www.ate.agilent.com/ste/products/intelligent test/SOC test/SOC Tec h Oview.shtml, represent these types of testing devices. Further testing devices are described in, for example, European Patent Application 1092983, European Patent Application 999450, European Patent Application 965845, European Patent Application 859318, European Patent Application 864977, European Patent Application 886214, European Patent Application 882991, U.S. Pat. No. 5,499,248, and U.S. Pat. No. 5,453,995.

In order to be able to ensure high quality for the tests of the testing device, it is essential to calibrate the test head electrically or electronically as precisely as possible. The measurement and/or calibration of the test head is performed with the aid of a device of the type initially described, a signal transmission having to be implemented on the more than, for example, 1000 contacts of the test head.

SUMMARY OF THE INVENTION

It is an object of the present invention to provide an embodiment for a device of the type initially described which improves the measurement and/or calibration of the test head. This object is achieved by the object of the independent claim. Advantageous embodiments are objects of the dependent claims.

The present invention is based on the idea of equipping the device with a contact head which has one or more measurement contacts for contacting the contacts of the test head and which may, using a positioning unit, automatically approach and contact all contacts necessary for measuring and/or calibrating the test head. In other words, the device is implemented in such a way that its contact head automatically approaches and contacts all contacts necessary for measuring and/or calibrating the test head, so that the device may perform the necessary measurements and/or calibration procedures automatically. The calibration of a test head equipped with a large number of contacts may, for example, last several hours, no interaction of operating personnel typically being necessary during this time; the advantage is obvious.

The device according to the present invention includes a contacting unit which comprises the contact head, including the positioning unit. According to a particularly advantageous embodiment, the control unit is housed in a base unit and the contacting unit may be implemented so it is removable from the base unit, the contacting unit being connected to the base unit via a flexible cable arrangement. In order to dock the contacting unit on the test head, the contacting unit may be removed from the base unit, which simplifies the handling of the device. This is because the contacting unit only comprises the components necessary for the automatic contacting of the contacts of the, test head, while the base unit comprises the components necessary for the actual measurements and calibration procedures, such as the computer, control units, power supply unit, and the like. In particular, power is supplied to the contacting unit via a cable arrangement, originating from the base unit.

In a refinement, the contacting unit may be implemented in such a way that it may be set down on the base unit with its docking side, which is attachable to the test head, upward and may also be set down on the base unit with its docking side downward. Through this construction, the spectrum of application of the device may be elevated. When the docking side points upward, the device may be moved under the test head, so that the test head may be set down on the contacting unit with its contact region pointing downward. When the docking side points downward, it is protected, so that damage, particularly fouling of the components of the contacting unit, may be avoided.

For the measurement and calibration of the test head, signal transmissions must be implemented on a large number, particularly on all, of the contacts of the test head—as described above. The measurement and/or calibration procedures typically include multiple individual measurements in this case, for each of which there must only be signal transmission at a comparatively small number of contacts, for example two. To perform the measurement and/or calibration of the test head, it is possible in principle to contact any desired number of contacts simultaneously. The individual measurements are then performed, for example, in that, with the aid of an appropriate relay matrix, the small number of contacts necessary for the respective individual measurement are activated, while all other contacts, which are not necessary for this individual measurement, are deactivated. According to a preferred embodiment of the present invention, the contact head has exactly enough measurement contacts so that in each case only the contacts of the test head necessary for the respective individual measurement are contacted. In this embodiment, electronic activation and deactivation of specific contacts, e.g., using a relay matrix, may be dispensed with. The signal transmission may therefore be performed directly, i.e., not via a selection circuit or relay matrix, and the quality of the transmittable signals, and therefore the quality of the measurements and the achievable calibration, may be improved.

BRIEF DESCRIPTION OF THE DRAWING

The present invention is described further in the following with reference to the drawing, identical reference numbers referring to identical or functionally identical or similar components.

DETAILED DESCRIPTION OF THE DRAWING

Figure 1:
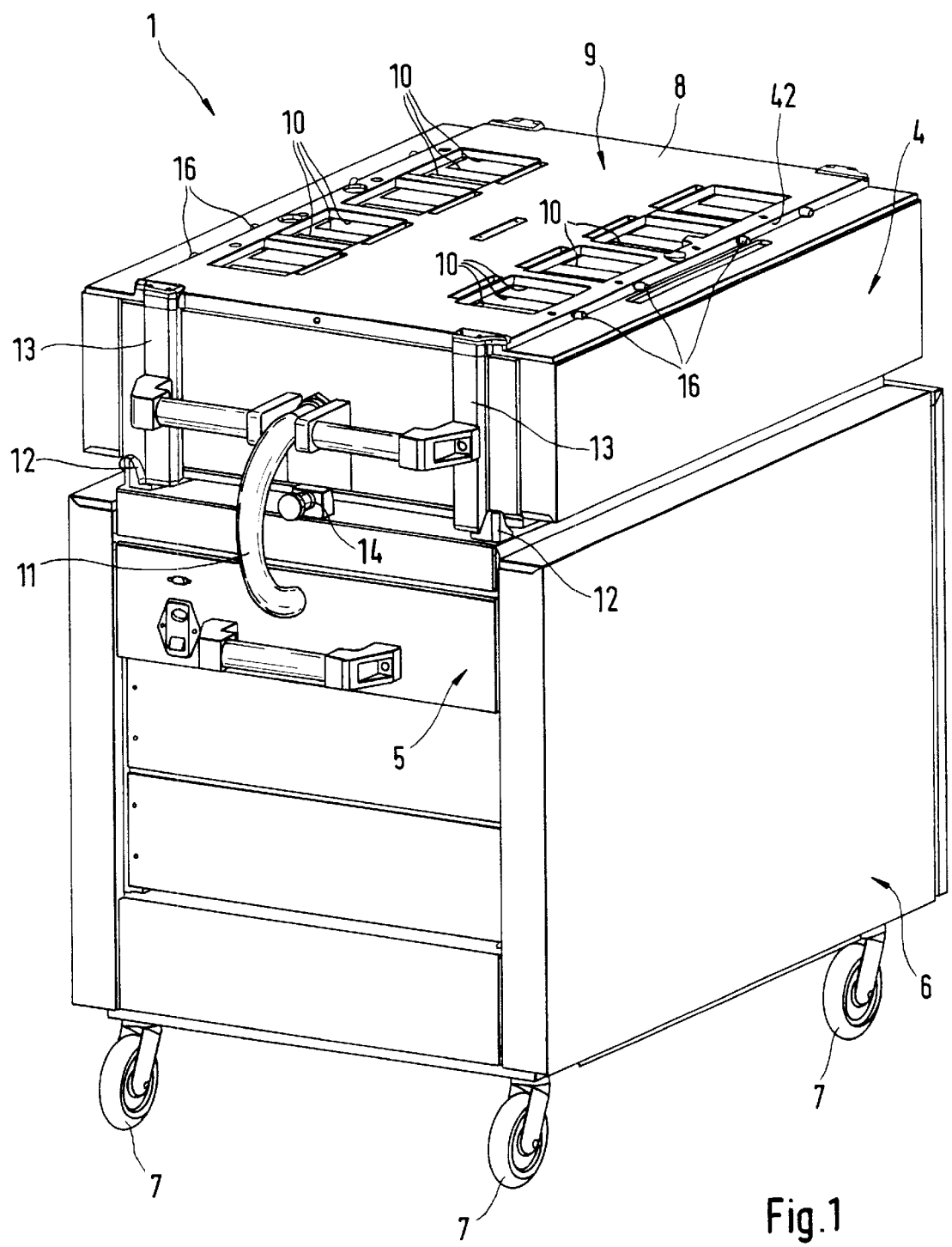
FIGS. 1 to 4 show schematic perspective views of a device according to the present invention in various situations.

As shown in FIGS. 1 to 4, a device 1 according to the present invention for measuring and/or calibrating a test head 2 of a testing device 3 for testing electronic components, e.g., microprocessors, has a contacting unit 4 and a base unit 5. Furthermore, device 1 has a truck 6, in which base unit 5 is housed and which may be moved using rollers 7.

Contacting unit 4 has a docking side 8, using which it may be docked on test head 2. As shown in FIG. 1, contacting unit 4 has a contact mask 9 on its docking side 8, which comprises multiple through holes 10 in predetermined arrays. Contact mask 9 forms a type of seal of contacting unit 4, which protects the components housed inside contacting unit 4 from fouling and improper contact. Contacting unit 4 is implemented so it is removable from base unit 5 and reversible. A flexible cable arrangement 11, which is expediently arranged on contacting unit 4 and/or on base unit 5 so it is extendable, ensures the power supply of contacting unit 4 and signal transmission between the components of contacting unit 4 and the components of base unit 5 in this case. Due to its removability from base unit 5 and its reversibility, contacting unit 4 may be set down on base unit 5 from above with its docking side 8 upward, cf. FIGS. 1 and 2, or with its docking side 8 downward, cf. FIG. 3.

For locating a predetermined relative position between contacting unit 4 and base unit 5, guide and/or centering elements are provided, namely corner elements 12 attached to a top 15 (cf. FIG. 4) of base unit 5 and rail elements 13 attached to contacting unit 4, which guide and center contacting unit 4 when contacting unit 4 is placed on the base unit. A first lock and/or catch device 14 allows secure fixing of contacting unit 4 on base unit 5.

Figure 2:
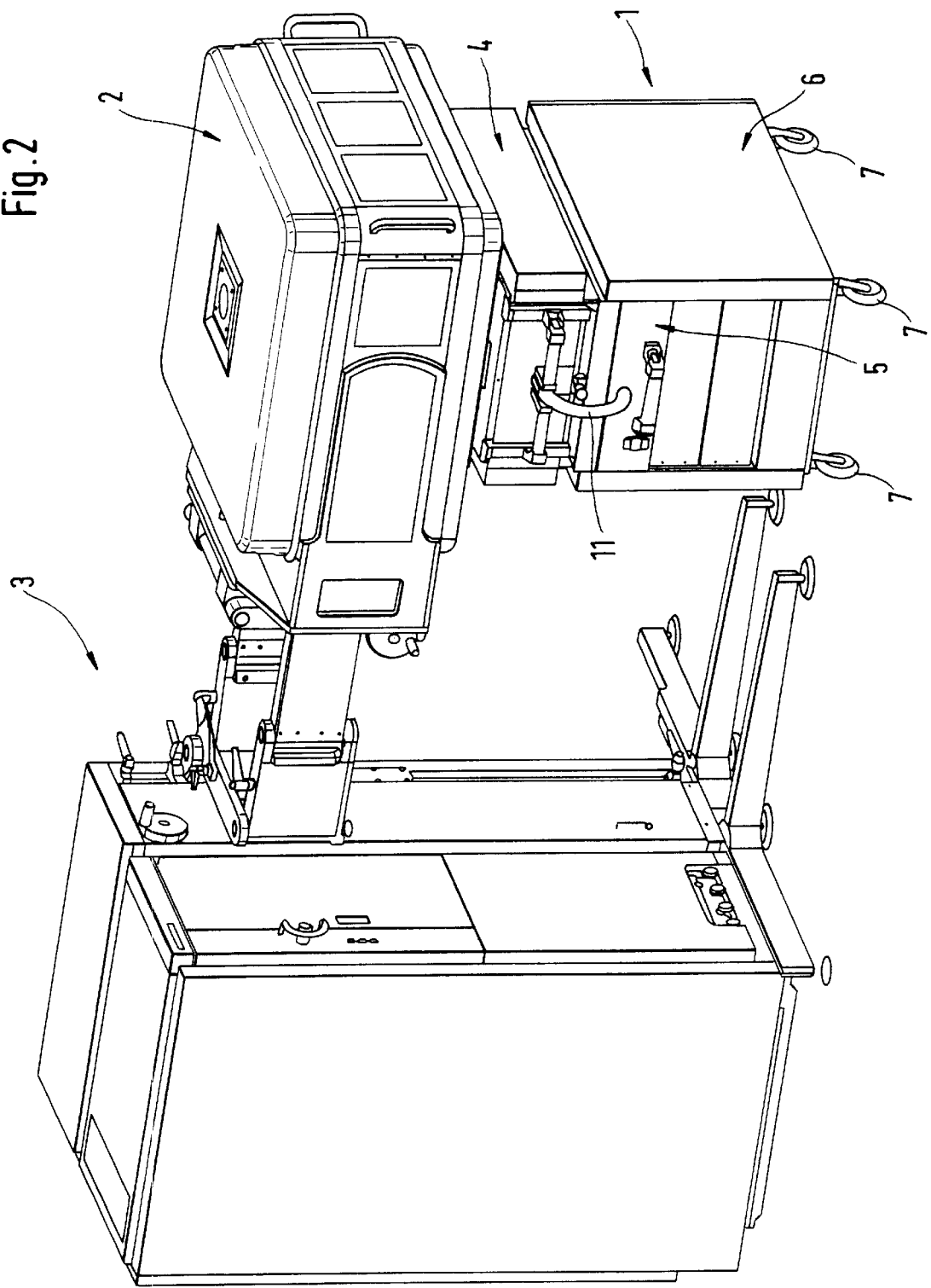

As shown in FIG. 2, device 1 may be moved under test head 2, test head 2 able to be placed from above on docking side 8 of contacting unit 4, in order to dock contacting unit 4 on test head 2. Docked contacting unit 4 covers a contact region of test head 2 in this case, which has multiple individual electric contacts, particularly in the form of spring-mounted contact pins. Through openings 10 of contact mask 9 are positioned and dimensioned so that the contacts of test head 2 penetrate through openings 10 upon docking and may be contacted by the inner side of contact mask 9, which faces away from the test head.

Figure 3:
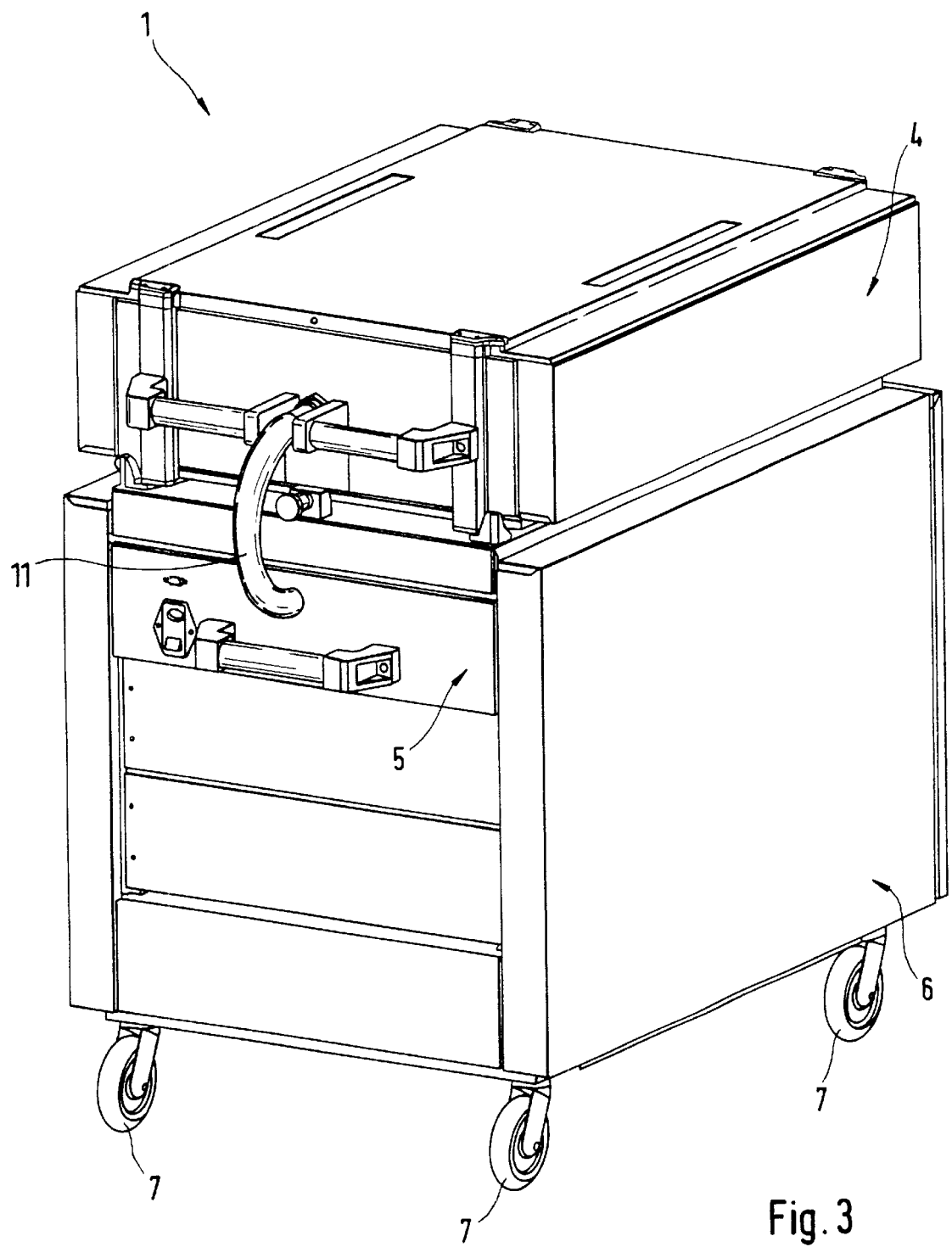
Figure 4:
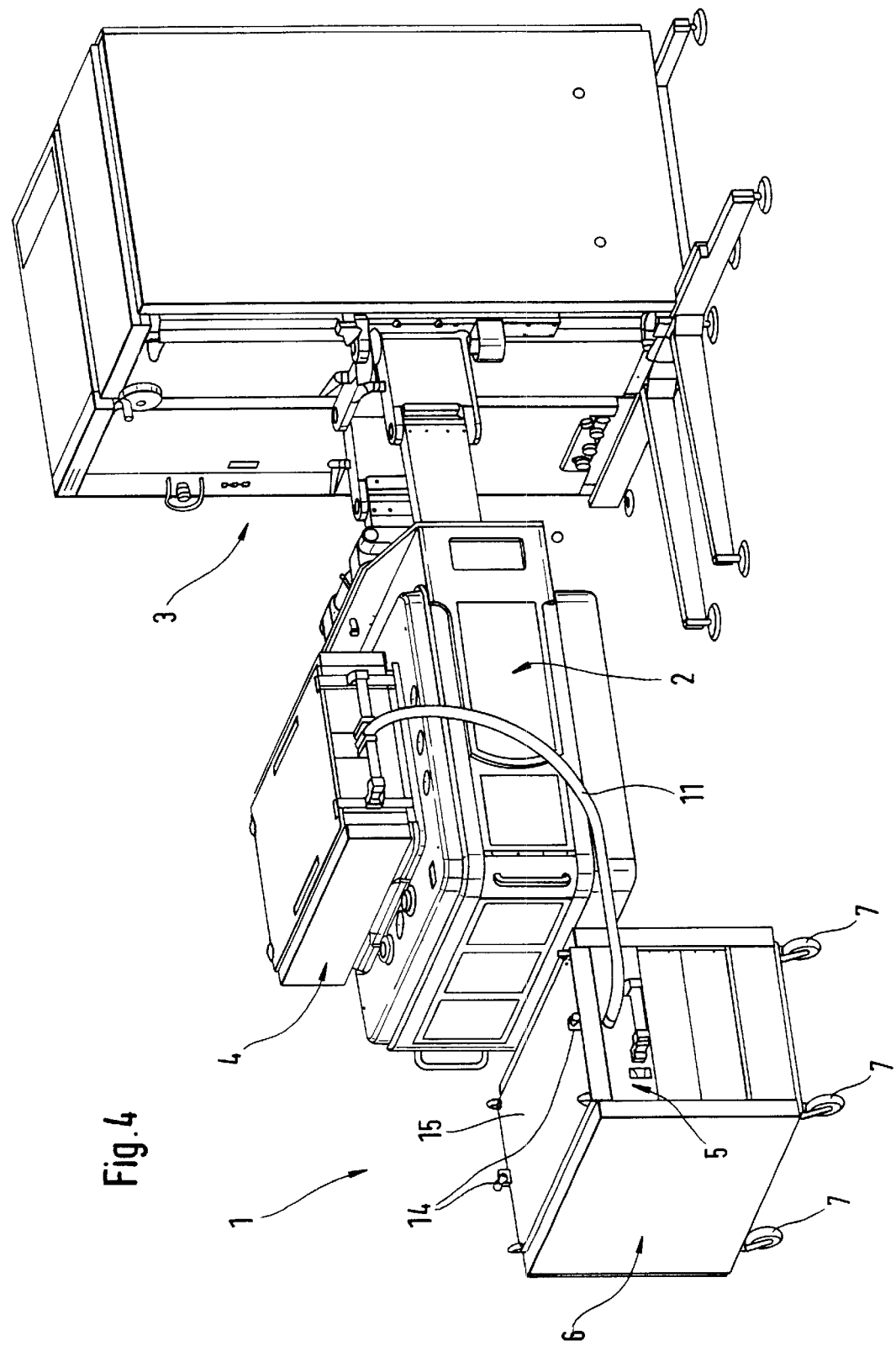

If contacting unit 4 is placed on base unit 5 with its docking side 8 downward, as in FIG. 3, docking side 8 is covered by top 15 (cf. FIG. 4) of base unit 5 and is protected particularly effectively from fouling. Since contacting unit 4 may be separated from base unit 5, it may be removed from base unit 5 and docked independently thereof on test head 2. As shown in FIG. 4, contacting unit 4 may, for example, be placed on the contact region of test head 2 from above. The removability of contacting unit 4 is advantageous, for example, if there is insufficient space below test head 2 for positioning unit 1 underneath it. In a preferred refinement, base unit 5 may also be designed so it is removable from truck 6, so that those test heads 2 which may not be approached by truck 6 for reasons of space are also reachable.

In order to fix contacting unit 4 on test head 2, a second lock and/or catch device may be provided, which includes, for example, pegs 16 implemented on contact mask 9, which work together with a suitable seal implemented on test head 2.

Figure 5:
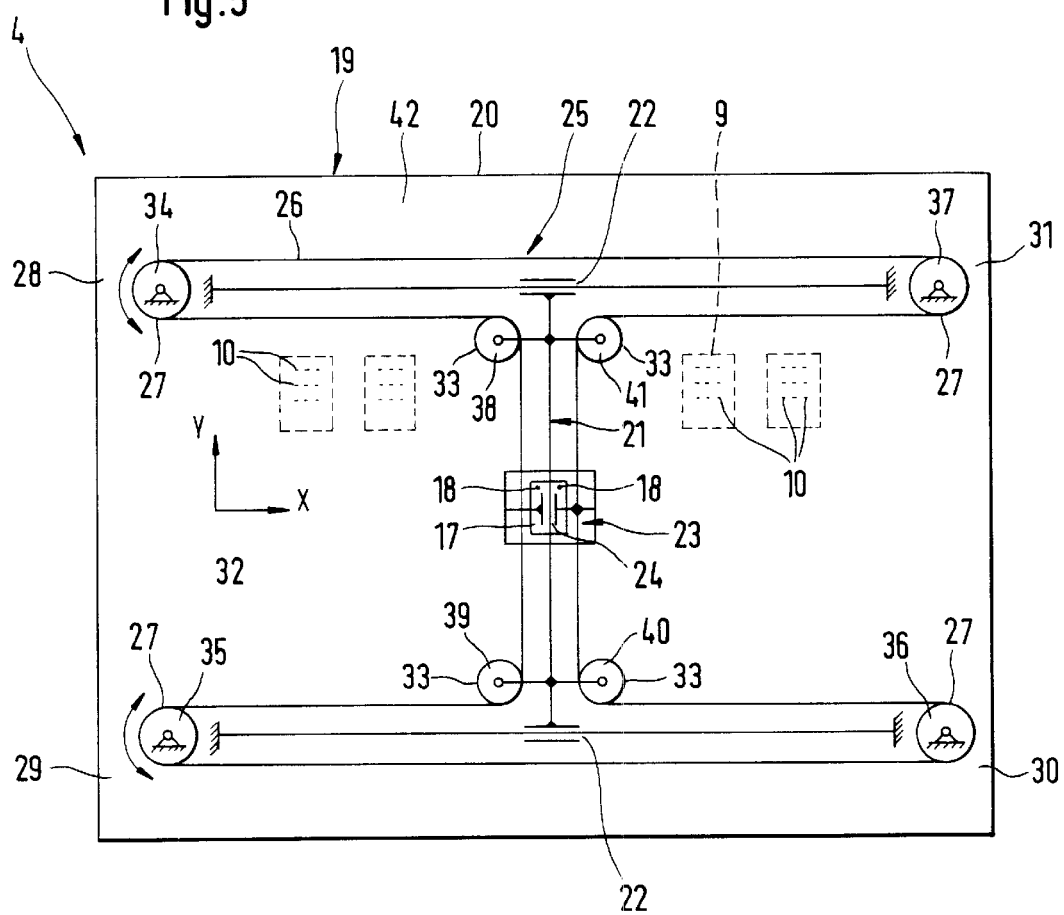
FIG. 5 shows a greatly simplified schematic illustration of a positioning unit of the device.

As shown in FIG. 5, contacting unit 4 comprises a contact head 17, which supports at least one, in this case two, measuring contacts 18. Measuring contacts 18 may be implemented, for example, as pin-shaped and comprise conical recesses on their axial faces, which may be placed in the axial direction on the free ends of the pin-shaped, spring-mounted contacts of test head 2, the contacts of test head 2 preferably being conically pointed.

Contact head 17 is movable within contacting unit 4, using a positioning unit 19, at least two-dimensionally in an XY plane which lies in the plane of the drawing of FIG. 5. In addition, contact head 17, or at least a section of contact head 17 which supports measuring contacts 18, may be adjusted in a Z direction running perpendicular to the XY plane.

Base unit 5 comprises a control unit for operating positioning unit 19. The control unit is implemented in this case in such a way that it operates positioning unit 19 so that, in calibrating operation of device 1, all of the contacts of test head 2 to be contacted for measuring and/or calibrating test head 2 are approached automatically by contact head 17 and contacted using its measuring contacts 18. The routine which executes automatically in this case comprises multiple individual measurements, during each of which a predetermined small number of contacts, two in this case, must be contacted simultaneously. According to the present invention, contact head 17 has precisely enough measuring contacts 18 so that exclusively the contacts of the test head necessary for the respective individual measurements may be contacted. This means that contact head 17 must be newly positioned after each individual measurement. The separate approach and contacting of exclusively the contacts necessary for the respective individual measurement is complicated and time-intensive, however, in return the measurement precision may be significantly increased, which has a positive effect on the quality of the calibration. The increased time consumption is of secondary significance in this case, because device 1 according to the present invention may perform the complete calibration procedure automatically, i.e., particularly without operating personnel.

As shown in FIG. 5, in a preferred embodiment, positioning unit 19 has a support frame 20, which is symbolized here by a rectangle. This support frame 20 may have a base plate 42 or be formed by a base plate 42, which lies in the plane of the drawing in this case. This base plate 42 is expediently positioned on docking side 8 of contacting unit 4, base plate 42 able to simultaneously implement contact mask 9. Some of the recesses and/or depressions having through openings 10 are indicated with dashed lines. A slide carriage 21 is positioned on this support frame 20, particularly on its base plate 42, within contacting unit 4, which is mounted on support frame 20 using a symbolically shown first linear guide 22 so it is adjustably guided in an X direction of the XY plane. A slide 23 is positioned on this slide carriage 21, which is mounted on slide carriage 21 with the aid of a second linear guide 24 so it is adjustably guided in a Y direction of the XY plane. The X direction is expediently perpendicular to the Y direction. Contact head 17 is now positioned on this slide 23, which, or its section supporting measuring contacts 18, is adjustable in the Z direction, i.e., perpendicular to the XY plane, an appropriate actuator able to be positioned on slide 23 and/or contact head 17 for this purpose. To move slide 23 and slide carriage 21, positioning unit 19 has a drive unit 25 which allows slide 23 to be adjusted relative to slide carriage 21 in the Y direction and slide carriage 21 to be adjusted relative to support frame 20 in the X direction.

In the embodiment shown here, drive unit 25 has a drive element 26 in the form of a band, chain, belt, cable, or strap, which shows an H-layout in the Z direction. Drive element 25 is implemented as flexible and with high tensile strength. The H-layout has a transverse leg between two lengthwise legs. Drive unit 25 has four stationary wheels 27, one of which is mounted in each of four corners 28, 29, 30, and 31, respectively, of a rectangular XY adjustment region 32 of contact head 17 on support frame 20. Furthermore, drive unit 25 has four moved wheels 33, which are each mounted on slide carriage 21, two moved wheels 33 being positioned on one end of slide carriage 21 in relation to the Y direction, while other two moved wheels 33 are positioned on the other end of slide carriage 21 in relation to the Y direction.

Two of stationary wheels 27, here the two shown on the left in FIG. 5, are implemented as drive wheels drivable by motor, namely a first drive wheel 34 assigned to first corner 28 and a second drive wheel 35 assigned to second corner 29. The motor assigned to respective drive wheels 34, 35 is not shown in this case. The drivability of drive wheel 34, 35 is symbolized in FIG. 5 by a double arrow in each case. The two other stationary wheels are each implemented as guide wheels, namely a first stationary guide wheel 36 assigned to third corner 30 and a second stationary guide wheel 37 assigned to fourth corner 31. Moved guide wheels 33 are referred to, in counterclockwise order, as first, second, third, and fourth moved guide wheels 38, 39, 40, and 41, respectively.

Drive element 26 is guided as follows: from first drive wheel 34 to first moved guide wheel 38, to second moved guide wheel 39, to second drive wheel 35, to first stationary guide wheel 36, to third moved guide wheel 40, to fourth moved guide wheel 41, to second stationary guide wheel 37, and back to first drive wheel 34. In this case, slide 23 is rigidly connected to drive element 26 between third and fourth moved guide wheels 40, 41. Alternatively, slide 23 may also be connected to drive element 26, so it is driven, between first and second moved guide wheels 38, 39.

Drive unit 25 functions as follows: in order to adjust contact head 17 exclusively in the positive X direction, first drive wheel 34 rotates counterclockwise, while second drive wheel 35 rotates clockwise, the rotational speeds of both drive wheels 34, 35 being equal. In this case, the transverse leg of the H-shape moves together with contact head 17 in the X direction. In order to move contact head 17 exclusively in the negative X direction, both drive wheels 34, 35 again rotate with the same rotational speed, however, first drive wheel 34 rotating clockwise, while second drive wheel 35 rotates counterclockwise. In order to drive contact head 17 exclusively in the positive Y direction, both drive wheels 34 and 35 rotate at the same rotational speed counterclockwise. In this case, contact head 17 moves along the transverse leg of the H-shape. To adjust contact head 17 exclusively in the negative Y direction, both drive wheels 34 and 35 rotate at the same rotational speed clockwise. If first drive wheel 34 rotates clockwise while second drive wheel 35 stands still, contact head 17 moves from top right toward bottom left. If first drive wheel 34 is driven counterclockwise while second drive wheel 35 is stopped, contact head 17 moves from bottom left to top right. If first drive wheel 34 stands still and second drive wheel 35 is driven clockwise, contact head 17 moves from top left to bottom right. If first drive wheel 34 is stopped and second drive wheel 35 is driven counterclockwise, contact head 17 moves from bottom right to top left. It is clear that through the combination of different rotational directions and rotational speeds, any arbitrary two-dimensional adjustment movements within XY movement range 32 may be implemented.

A particular advantage of drive unit 25 shown here is that the drive motors are positioned stationary on support frame 20, so that the mass moved, i.e., contact head 17, slide 23, and slide carriage 21, is relatively small. Correspondingly, inertial effects may be reduced. Positioning unit 19 may therefore operate very rapidly and highly precisely. A further advantage is that no trailing cable installation is necessary for power supply and control of the drive motors, which greatly simplifies the construction of positioning unit 19.

Figure 6:
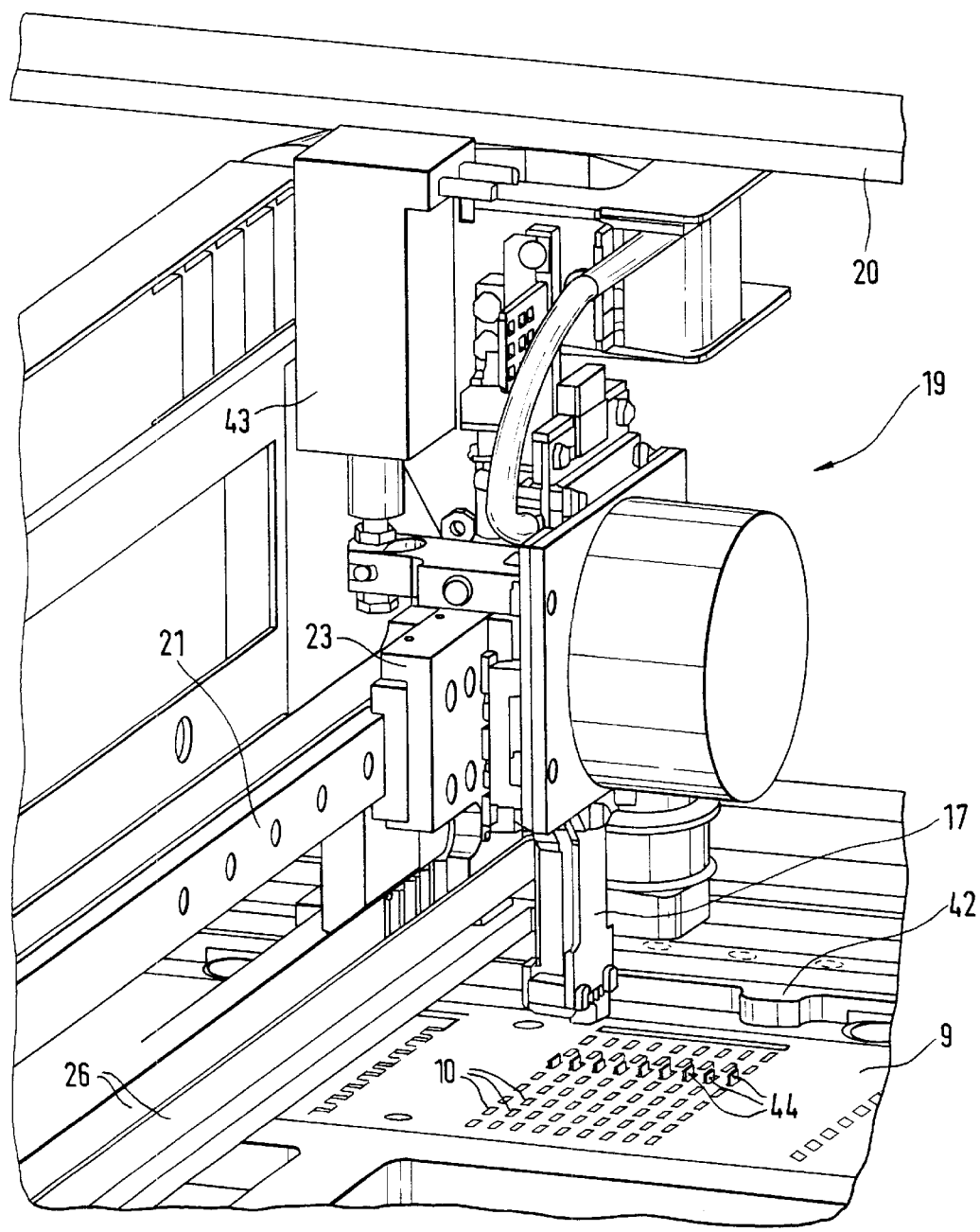
FIG. 6 shows a schematic perspective view of a contact head.

An expedient embodiment of contact head 17, which is mounted on slide 23 using a pneumatic or electric actuator 43 so it is adjustable in the Z direction, is shown in FIG. 6. Measuring contacts 18 of contact at 17 are not visible in this view, multiple contacts 44 of test head 2 are shown instead, which penetrate through openings 10 of base plate 42 and/or contact mask 9. In FIG. 6, contact head 17 is in non-usage position, in which it is adjustable in the XY plane. Through an appropriate operation of actuator 43, contact head 17 may then be moved into a usage position to be adjusted in the Z direction toward contacts 44, in order to contact respective contacts 44 using its measuring contacts 18.

What is claimed is:

1. A device for electrical measurement and/or calibration of a test head of a testing device for testing electronic components, particularly microprocessors, the test head having multiple electric contacts which are positioned in a contact region, wherein
the device has a contacting unit,
the contacting unit is adapted to be docked on the test head using a docking side in such a way that the contacting unit at least partially covers the contact region of the test head,
the contacting unit comprises a contact head, which has at least one measuring contact for contacting the contacts of the test head,
the contact head is movable multi-dimensionally within the contacting unit using a positioning unit in such a way that the contact head is adapted to approach and contact at least multiple contacts of the contact region,
the device comprises a control unit which operates the positioning unit in calibration operation so that multiple or all contacts of the contact region to be contacted for the measurement and/or calibration of the test head can be automatically approached and contacted by the contact head,
wherein
a drive unit of the positioning unit has a drive element, which is flexible and has high tensile strength, which is arranged in an H-shape and so it circulates endlessly, and which is connected directly or indirectly to the contact head to drive it,
the contact head is adjustable along the transverse leg of the H-shape by suitable driving of the drive element, and
the transverse leg, with the contact head, is adjustable along the lengthwise legs of the H-shape by suitable driving of the drive element.

2. A device for electrical measurement and/or calibration of a test head of a testing device for testing electronic components, particularly microprocessors, the test head having multiple electric contacts which are positioned in a contact region, wherein
the device has a contacting unit,
the contacting unit is adapted to be docked on the test head using a docking side in such a way that the contacting unit at least partially covers the contact region of the test head, the contacting unit comprises a contact head, which has at least one measuring contact for contacting the contacts of the test head, the contact head is movable multi-dimensionally within the contacting unit using a positioning unit in such a way that the contact head is adapted to approach and contact at least multiple contacts of the contact region, the device comprises a control unit which operates the positioning unit in calibration operation so that multiple or all contacts of the contact region to be contacted for the measurement and/or calibration of the test head can be automatically approached and contacted by the contact head, wherein the positioning unit has a support frame, a slide carriage is mounted on the support frame within the contacting unit so it is adjustable linearly guided in an X direction of the XY plane, a slide is mounted on the slide carriage so it is adjustable linearly guided in a Y direction of the XY plane, the slide carries the contact head, and the positioning unit has a drive unit, using which the slide is adjustable relative to the slide carriage in the Y direction and the slide carriage is adjustable relative to the support frame in the X direction.

3. A device for electrical measurement and/or calibration of a test head of a testing device for testing electronic components, particularly microprocessors, the test head having multiple electric contacts which are positioned in a contact region, wherein the device has a contacting unit, the contacting unit is adapted to be docked on the test head using a docking side in such a way that the contacting unit at least partially covers the contact region of the test head, the contacting unit comprises a contact head, which has at least one measuring contact for contacting the contacts of the test head, the contact head is movable multi-dimensionally within the contacting unit using a positioning unit in such a way that the contact head is adapted to approach and contact at least multiple contacts of the contact region, the device comprises a control unit which operates the positioning unit in calibration operation so that multiple or all contacts of the contact region to be contacted for the measurement and/or calibration of the test head can be automatically approached and contacted by the contact head, wherein a drive unit of the positioning unit has a drive element, in the form of a band, chain, belt, cable, or strap, which is guided as follows:

via a first drive wheel, drivable using a motor, which is mounted in a first corner of an essentially rectangular XY adjustment region of the contact head, adjoining a support frame, via a first moved guide wheel, which is mounted on a slide carriage, in relation to the Y direction, on an end of the slide carriage facing the first corner, via a second moved guide wheel, which is mounted on the slide carriage, in relation to the Y direction, on an end of the slide carriage facing away from the first corner, via a second drive wheel, drivable using a motor, which is mounted in a second corner on the XY adjustment region, adjoining the support frame, via a first stationary guide wheel, which is mounted in a third corner on the XY adjustment region, adjoining the support frame, via a third moved guide wheel, which is mounted on the slide carriage, in relation to the Y direction, on an end of the slide carriage facing the third corner, via a fourth, moved guide wheel, which is mounted on the slide carriage, in relation to the Y direction, on an end of the slide carriage facing away from the third corner, via a second stationary guide wheel, which is mounted in a fourth corner on the XY adjustment region, adjoining the support frame, back to the first drive wheel again, a slide; carrying the contact head is connected to the drive element between the first moved guide wheel and the second moved guide wheel or between the third moved guide wheel and the fourth moved guide wheel.

4. A device for electrical measurement and/or calibration of a test head of a testing device for testing electronic components, particularly microprocessors, the test head having multiple electric contacts which are positioned in a contact region, wherein the device has a contacting unit, the contacting unit is adapted to be docked on the test head using a docking side in such a way that the contacting unit at least partially covers the contact region of the test head, the contacting unit comprises a contact head, which has at least one measuring contact for contacting the contacts of the test head, the contact head is movable multi-dimensionally within the contacting unit using a positioning unit in such a way that the contact head is adapted to approach and contact at least multiple contacts of the contact region, the device comprises a control unit which operates the positioning unit in calibration operation so that multiple or all contacts of the contact region to be contacted for the measurement and/or calibration of the test head can be automatically approached and contacted by the contact head.

5. The device according to claim 4, wherein all of the components of the device which move during a measurement and/or calibration of the test head are positioned in or on the contacting unit, the device has a base unit which exclusively comprises components of the device which are not moved during a measurement and/or calibration of the test head.

6. The device according to claim 4, wherein the device has a base unit, in which the control unit is housed, and the contacting unit is implemented so it is removable from the base unit, the contacting unit being connected to the base unit via a flexible cable arrangement.

7. The device according to claim 6, wherein the contacting unit may be placed on the base unit from above.

8. The device according to claim 6, wherein the contacting unit is implemented so that it may be placed on the base unit with its docking side upward or with its docking side downward.

9. The device according to claim 6, wherein guide and/or centering elements are provided allowing locating a predetermined relative position between the contacting unit and the base unit.

10. The device according to claim 4, wherein
the contacting unit has a contact mask on its docking side, which comprises through openings at least for the contacts of the test head to be contacted,
the contacts of the test head penetrate the respective through openings during docking,
the contact head contacts the contacts of the test head on the inner side of the contact mask, which faces away from the test head.

11. The device according to claim 4, wherein
the measurement and/or calibration of the test head comprises multiple individual measurements,
a predetermined number of contacts of the test head have to be contacted for each individual measurement,
the contact head has precisely enough measurement contacts so that only the contacts necessary for the respective individual measurement are contacted during each individual measurement.

12. The device according to claim 4, wherein a base unit of the device is housed in a truck.

13. The device according to claim 12, wherein the base unit is implemented so it is removable from the truck.

14. The device according to claim 4, wherein at least one lock and/or catch unit is provided, using which the contacting unit is fixable on a base unit of the device and/or on the test head.

15. The device according to claim 4, wherein the contact head, or at least a section of the contact head having the measurement contact/s, is adjustable, relative to a slide, in a Z direction, which runs perpendicular to an XY plane in which the slide is adjustable.

16. The device according to claim 4, wherein the positioning unit is operable to move the contact head three dimensionally, including moving the contact head two dimensionally in a plane and moving the contact head in a direction perpendicular to the plane.

17. A device for electrical measurement and/or calibration of a test head of a testing device for testing electronic components, particularly microprocessors, the test head having multiple electric contacts which are positioned in a contact region,
wherein
the device has a contacting unit,
the contacting unit is adapted to be docked on the test head using a docking side in such a way that the contacting unit at least partially covers the contact region of the test head,
the contacting unit comprises a contact head, which has at least one measuring contact for contacting the contacts of the test head,
the contact head is movable multi-dimensionally within the contacting unit using a positioning unit in such a way that the contact head is adapted to approach and contact at least multiple contacts of the contact region,
the device comprises a control unit which operates the positioning unit in calibration operation so that multiple or all contacts of the contact region to be contacted for the measurement and/or calibration of the test head can be automatically approached and contacted by the contact head,
the device has a base unit, in which the control unit is housed, and the contacting unit is implemented so it is removable from the base unit, the contacting unit being connected to the base unit via a flexible cable arrangement, and
the cable arrangement is positioned on the contacting unit and/or on the base unit so it is extendable.

18. A method for electric or electronic measurement and/or calibration of a test head of a testing device for testing electronic components, particularly microprocessors, with the steps of
docking a contacting unit on the test head using a docking side in such a way that the contacting unit at least partially covers a contact region of the test head, in which multiple electric contacts of the test head are positioned,
using a positioning unit for moving a contact head, which has at least one measuring contact for contacting the contacts of the test head, multi-dimensionally within the contacting unit, in such a way that the contact head approaches and contacts at least multiple contacts of the contact region,
operating the positioning unit in calibration operation so that multiple or all contacts of the contact region to be contacted for the measurement and/or calibration of the test head are automatically approached and contacted by the contact head.

19. The device according to claim 18, wherein the positioning unit is operable to move the contact head three dimensionally, including moving the contact head two dimensionally in a plane and moving the contact head in a direction perpendicular to the plane.

* * * * *